United States Patent
Jordan

(10) Patent No.: US 8,912,845 B2
(45) Date of Patent: Dec. 16, 2014

(54) MULTIPLE WINDING TRANSFORMER COUPLED AMPLIFIER

(71) Applicant: Edward Perry Jordan, Kernersville, NC (US)

(72) Inventor: Edward Perry Jordan, Kernersville, NC (US)

(73) Assignee: Analog Devices, Inc., Norwood, MA (US)

( * ) Notice: Subject to any disclaimer, the term of this patent is extended or adjusted under 35 U.S.C. 154(b) by 59 days.

(21) Appl. No.: 13/736,028

(22) Filed: Jan. 7, 2013

(65) Prior Publication Data

US 2014/0191800 A1 Jul. 10, 2014

(51) Int. Cl.
*H03F 1/34* (2006.01)
*H03F 1/00* (2006.01)

(52) U.S. Cl.
CPC .................................. *H03F 1/00* (2013.01)
USPC ............................................. 330/79; 330/283

(58) Field of Classification Search
USPC ................................... 330/79, 109, 283, 294
See application file for complete search history.

(56) References Cited

U.S. PATENT DOCUMENTS

| | | | |
|---|---|---|---|
| 3,656,831 A * | 4/1972 | Seidel | 330/85 |
| 5,280,648 A | 1/1994 | Dobrovolny | |
| 5,559,377 A * | 9/1996 | Abraham | 307/104 |
| 6,026,286 A | 2/2000 | Long | |
| 6,424,227 B1 | 7/2002 | El-Sharawy | |
| 6,566,963 B1 | 5/2003 | Yan et al. | |
| 7,136,764 B2 | 11/2006 | Adan | |
| 7,843,272 B2 * | 11/2010 | Yamaguchi | 330/301 |
| 8,044,759 B2 | 10/2011 | Yang et al. | |

FOREIGN PATENT DOCUMENTS

EP 2466746 6/2012

OTHER PUBLICATIONS

K. van Hartingsveldt et al., "HF Low Noise Amplifiers with Integrated Transformer Feedback", Circuits and Systems, 2002. ISCAS 2002, IEEE International Symposium vol. 2, May 26, 2002-May 29, 2002, ISBN 0-7803-7448-7, 8 pages.

K. Dasgupta et al., "Parasitic Aware Impedence Matching Techniques for RF Amplifiers", Analog Integr Circ Sig Process (2012) 70:91-102, DOI 10.1007/s10470-011-9659-9, Received: Oct. 21, 2008 / Revised: Feb. 20, 2011 / Accepted: May 20, 2011 / Published online: Jun. 5, 2011 (c) Springer Science+Business Media, LLC 2011, 12 pages.

Haito Gan, "On-Chip Transformer Modeling, Characterization, and Applications in Power and Low Noise Amplifiers", Ph.D. Dissertation, Department of Electrical Engineering, Stanford University, Stanford, CA © Mar. 2006, 120 pages http://marco.stanford.edu/swong/Haitao.pdf.

(Continued)

*Primary Examiner* — Steven J Mottola
(74) *Attorney, Agent, or Firm* — Patent Capital Group

(57) ABSTRACT

An integrated circuit includes a radio frequency (RF) amplifier having a trifilar transformer coupled to a gain device in two negative feedback paths. The trifilar transformer includes a first winding, a second winding and a third winding, a first dielectric core is disposed between the first winding and the second winding, and a second dielectric core is disposed between the second winding and the third winding. A first winding ratio between the first winding and the second winding combined with a second winding ratio between the second winding and the third winding affects a total gain of the RF amplifier. In a specific embodiment, the gain device is a transistor, the first winding is coupled to a base of the transistor, the second winding is coupled to a collector of the transistor, and the third winding is coupled to an emitter of the transistor.

20 Claims, 4 Drawing Sheets

(56) References Cited

OTHER PUBLICATIONS

Kehrer, "Design of Monolithic Integrated Lumped Transformers in Silicon-based Technologies up to 20 GHz", Master's Thesis, Technical University of Vienna, Institute of Communication and Radio Frequency Engineering, Gusshausstrasse 25/389, A-1040 Vienna, Austria, Dec. 2000, 85 pages.

1300MHz to 2700MHz Variable-Gain Amplifier with Analog Gain Control, MAXIM, MAX2057, 19-3510; Rev. 1; Dec. 2010, www.maxim.ic-com, 13 pages.

Thuringer, "Characterization of Integrated Lumped Inductors and Transformers, " Ph.D. Dissertation, Technical University of Vienna, Institute of Communication and Radio Frequency Engineering, Gusshausstrasse E389, A-1040 Vienna, Austria, Apr. 2002, 75 pages.

H.Y. D . Yang et al., "Design and Analysis of On-Chip Symmertric Parallel-Plate Coupled-Line Balun for Silicon RF Integrated Circuits", Radio Frequency Integrated Circuits (RFIC) Symposium, 2003, IEEE, Jun. 8-10, 2003, ISBN 0-7803-7694-3, 4 pages.

John R. Long, "Monolithic Transformers for Silicon RF IC Design", IEEE Journal of Solid-State Circuits, vol. 35, No. 9, Sep. 2000, 0018-9200/00$10.00 © 2000 IEEE, 15 pages.

* cited by examiner

MULTIPLE WINDING TRANSFORMER COUPLED AMPLIFIER

FIELD OF THE DISCLOSURE

This disclosure relates in general to the field of electronic devices and, more particularly, to a multiple winding transformer coupled amplifier.

BACKGROUND

Radio frequency (RF) amplifiers are increasingly used in many applications, including military, medical, communication, and consumer applications. Example applications of RF amplifiers include driving to another high power source, driving a transmitting antenna, microwave heating, and exciting resonant cavity structures. RF amplifiers can be generally used in high performance signal chains, where distortion performance, signal-to-noise ratio, and low power consumption is desired. RF amplifiers are also used in transmitter and receiver stages in communications and other signal processing devices. Reliable, efficient, and compact amplifiers can improve overall system performance in varied applications.

SUMMARY OF THE DISCLOSURE

An integrated circuit includes an RF amplifier having a trifilar transformer coupled to a gain device in two negative feedback paths. The trifilar transformer includes a first winding, a second winding, a third winding, a first dielectric core disposed between the first winding and the second winding, and a second dielectric core disposed between the second winding and the third winding. A first winding ratio between the first winding and the second winding combined with a second winding ratio between the second winding and the third winding sets a total gain of the RF amplifier. In a specific embodiment, the gain device is a transistor, the first winding is coupled to a base of the transistor, the second winding is coupled to a collector of the transistor, and the third winding is coupled to an emitter of the transistor.

In specific embodiments, the first winding is further coupled to an input to the RF amplifier, the second winding is further coupled to an output of the RF amplifier and a power supply, and the third winding is further coupled to a ground (e.g., reference voltage from which other voltages are measured in the system). In some embodiments, a degeneration resistor may be coupled between the emitter and the third winding. In other embodiments, an alternating current blocking choke between the first winding and the base may provide a direct current bias to the base of a bipolar transistor.

In some embodiments, an additional RF amplifier having a second trifilar transformer coupled to another gain device may be cascaded with the RF amplifier for higher gain amplification, with the second trifilar transformer coupled to an output of the RF amplifier. A matching network may be provided at the output of the second RF amplifier to match output impedance, and another matching network may be provided at an input of the RF amplifier to match input impedance. In another embodiment, an active matching network may be provided across the trifilar transformer to match the input impedance.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

DETAILED DESCRIPTION

Figure 1:
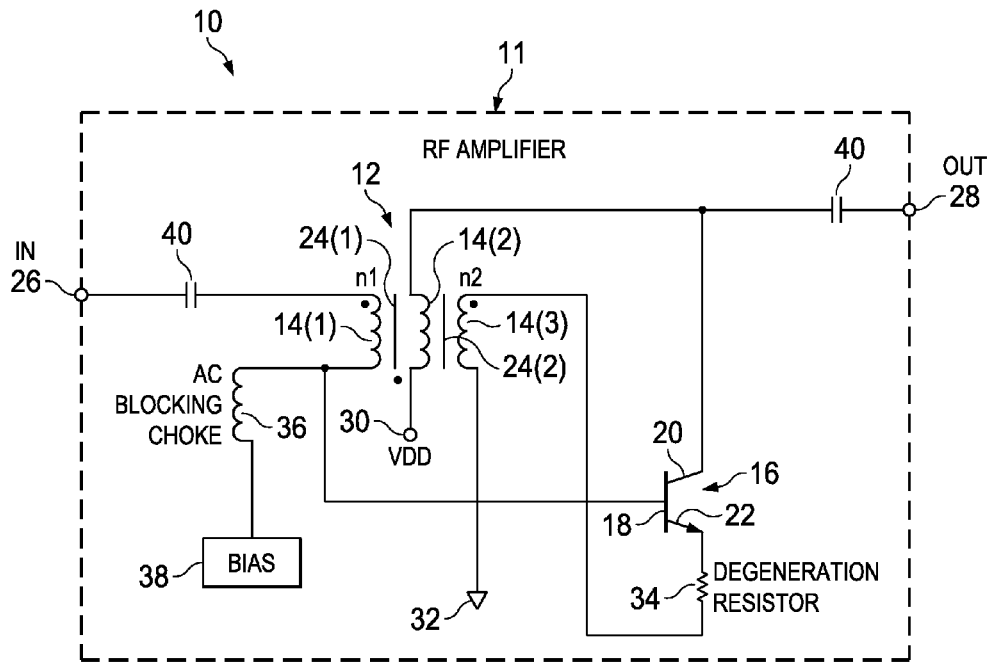
FIG. 1 is a simplified circuit diagram of an integrated circuit having a multiple winding transformer coupled amplifier in accordance with one embodiment.

The present disclosure provides for a more linear RF amplifier on a smaller chip footprint (e.g., semiconductor chip area) than currently available RF amplifiers in accordance with some embodiments. In general, a typical on-chip transformer can be generally configured as a multi-port (e.g., 2-port, 3-port, or 4-port) device. The number of ports may be based upon the specific application of the transformer. For example, a 2-port transformer may be used in differential circuits, for example, as a source-degenerated inductor in low noise amplifier (LNA) circuits. A 3-port transformer is often used as a single-ended to differential converter (balun) in LNA and power amplifier (PA) circuits. A 4-port transformer is often used in differential mixer circuits. Properties of the transformer, such as coupling coefficient k, the turn ratio n, and other parameters may vary considerably depending on the physical structure of the transformer.

Transformers are typically used to increase linearity of the transistors in the amplifiers, or set the gain of the amplifiers. In one configuration, a regular transformer, comprising a primary winding and a secondary winding may be coupled to the collector and base of the transistor (one of the windings being coupled to the collector, and the other being coupled to the base). The gain of each stage of the RF amplifier (in cascaded amplifiers having multiple transistors) is generally set by the transformers ratio so that the output swing is a function of the input voltage and the gain of each stage. The transformer may also provide output impedance matching.

Common-emitter amplifiers typically provide an inverted output with a high gain that may vary widely from one transistor to the next. Stability due to unintentional positive feedback may be associated with such high gain circuits. A common way to alleviate positive feedback is to use negative feedback. In one configuration that provides negative feedback, a transformer comprising a primary winding and a secondary winding may be coupled to the emitter of the transistor. The collector current $I_c$ may be inverted and fed back into the emitter, producing a negative feedback effect to lower and set the gain of the transistor. The amplifier has lower noise than an equivalent resistive amplifier, but the linearity is not sufficient for higher swings and lower distortion. In yet another configuration, to achieve higher linearity, a resistively loaded and degenerated gain stage can be implemented by adding a degeneration resistor (or any impedance) between the emitter and the common signal source (e.g., the ground). Resistive implementations typically have higher noise than transformer coupled approaches. If the resistive loads are made small enough to meet the bandwidth and operating frequencies, then the input and output impedances are typically too low to effectively match to a standard 50 Ohm system. Such amplifiers also tend to burn higher power with smaller resistive loads.

In yet another configuration, two separate, regular transformers, each having their separate primary and secondary windings may be cascaded to the collector and base of the transistor. For example, the primary winding of both the transformers may be coupled to the base; the secondary winding of one of the transformers may be coupled to the collector and the secondary winding of the other transformer. The gain can improve, with improved linearity in such configuration. However, using more than one transformer can increase chip area.

Depending on whether lateral or vertical magnetic coupling is used, on-chip transformer structures can have two categories: planar or stacked. The planar transformer is realized on a single metallization layer in the semiconductor chip. Planar transformers usually occupy a large area on the chip. A stacked transformer may use different metal layers in the semiconductor chip. For example, a stacked trifilar transformer may use three metal layers. Compared to the planar transformer with the same inductance, the area occupied by the stacked transformer is relatively small. In general, a planar structure has a large area, better quality factor of the primary and secondary inductors, and high self-resonant frequency, whereas a stacked structure has a small area, and low self-resonant frequency. However, in a stacked transformer, the coupling of the transformer may be reduced so more windings may be required, and may require a larger chip area.

For example, an application may need a high frequency variable gain amplifier (VGA) to operate from 1.7 GHz to 2.5 GHz with high linearity and minimum chip area. The VGA amplifier may operate with a single ended input and a single ended output with relatively high output power into 50 Ohms (5 dBm). Existing circuit designs can achieve some of the linearity specifications with multiple transformers for each stage. However, multiple transformers may result in large die area, which is not desirable. If single (or no) transformers are used, chip area may be small, but the linearity may suffer.

Turning to FIG. 1, FIG. 1 is a simplified block diagram of an integrated circuit 10 comprising a multiple winding transformer coupled amplifier. Integrated circuit 10 includes an RF amplifier 11 having a trifilar transformer 12, including three windings 14(1)-14(3), coupled to a gain device 16. As used herein, the term "trifilar transformer" includes a transformer with three windings. The term "gain device" includes any electronic circuit component configured to increase a signal property (e.g., current, voltage, power, etc.) of an incoming electrical signal. In a specific embodiment as illustrated in the FIGURE, gain device 16 may be a transistor (e.g., Field Effect Transistor (FET), Bipolar Junction Transistor (BJT)) having a base 18, collector 20, and an emitter 22. As used herein, the term "base" refers to a terminal of gain device 16 that is connected to an input of the RF amplifier; the term "emitter" refers to a terminal of gain device 16 that is connected to a ground; and the term "collector" refers to a terminal of gain device 16 that is connected to an output of the RF amplifier. A dielectric core 24(1) may be disposed between windings 14(1) and 14(2) in trifilar transformer 12, and another dielectric core 24(2) may be disposed between windings 14(2) and 14(3).

According to various embodiments, winding 14(1) may be coupled to base 18, winding 14(2) may be coupled to collector 20, and winding 14(3) may be coupled to emitter 22. Winding 14(1) may be further coupled to an input 26 of RF amplifier 11; winding 14(2) may be coupled to an output 28 of RF amplifier 11 and a source of power supply VDD 30; and winding 14(3) may be further coupled to a ground 32. In some embodiments, a degeneration resistor 34 may be disposed between emitter 22 and winding 14(3), for example, to increase linearity of RF amplifier 11. In some embodiments, an alternating current (AC) blocking chock 36 may be disposed between base 18 and winding 14(1), for example, to provide a direct current (DC) supply from a bias 38. Decoupling capacitors 40 may also be included in RF amplifier 11 to decouple the DC current from input 26 and output 28.

In various embodiments, trifilar transformer 12 is coupled to gain device 16 in two negative feedback paths. DC path from bias 38 may see a short at AC blocking choke 36 and primary winding 14(1), and an open at decoupling capacitor 40 at input 28. Thus, DC current is directed from bias 38 to base 18. AC input from input 28 may see a short at decoupling capacitor 40, and a resistive path at trifilar transformer 12 and AC blocking choke 36.

The architecture of integrated circuit 10 uses windings 14(2) and 14(3) in negative feedback to lower the gain of gain device 16, and to linearize gain device 16 in the desired frequency range. The n1 transformer ratio of windings 14(1) to 14(2) combined with the n2 transformer ratio of windings 14(2) to 14(3) on trifilar transformer 12 may set the total gain of the RF amplifier approximately by $(n1 \times n2)/(n1+n2)$. Degeneration resistor 34 in the RF amplifier can also be included to help linearize the RF amplifier and to help assure that thermal runaway would not exist if multiple transistors were used. In specific embodiments, integrated circuit 10 may be implemented in a high performance variable gain amplifier (VGA) with analog gain control designed to interface with 50Ω loads operating in the 1700 MHz to 2500 MHz frequency range. Various other loads and frequency ranges may be implemented within the broad scope of the embodiments.

Figure 2C:
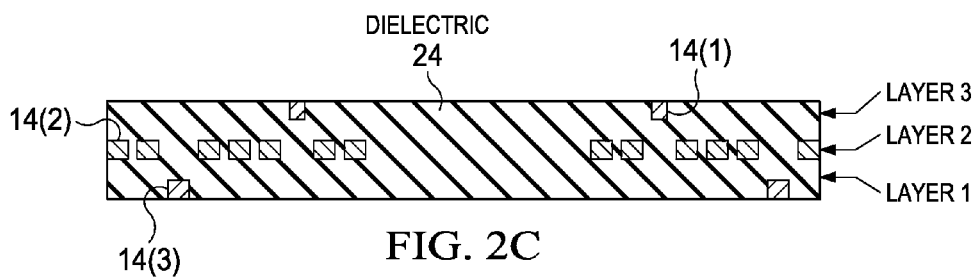
FIGS. 2A-2D are simplified block diagrams of example details of the transformer according to one or more embodiments.
Figure 2D:
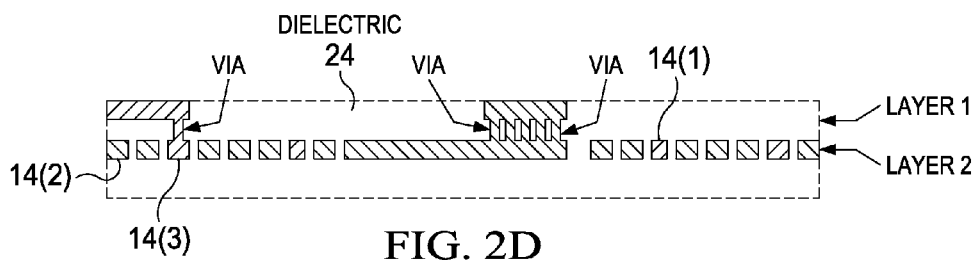
Figure 2A:
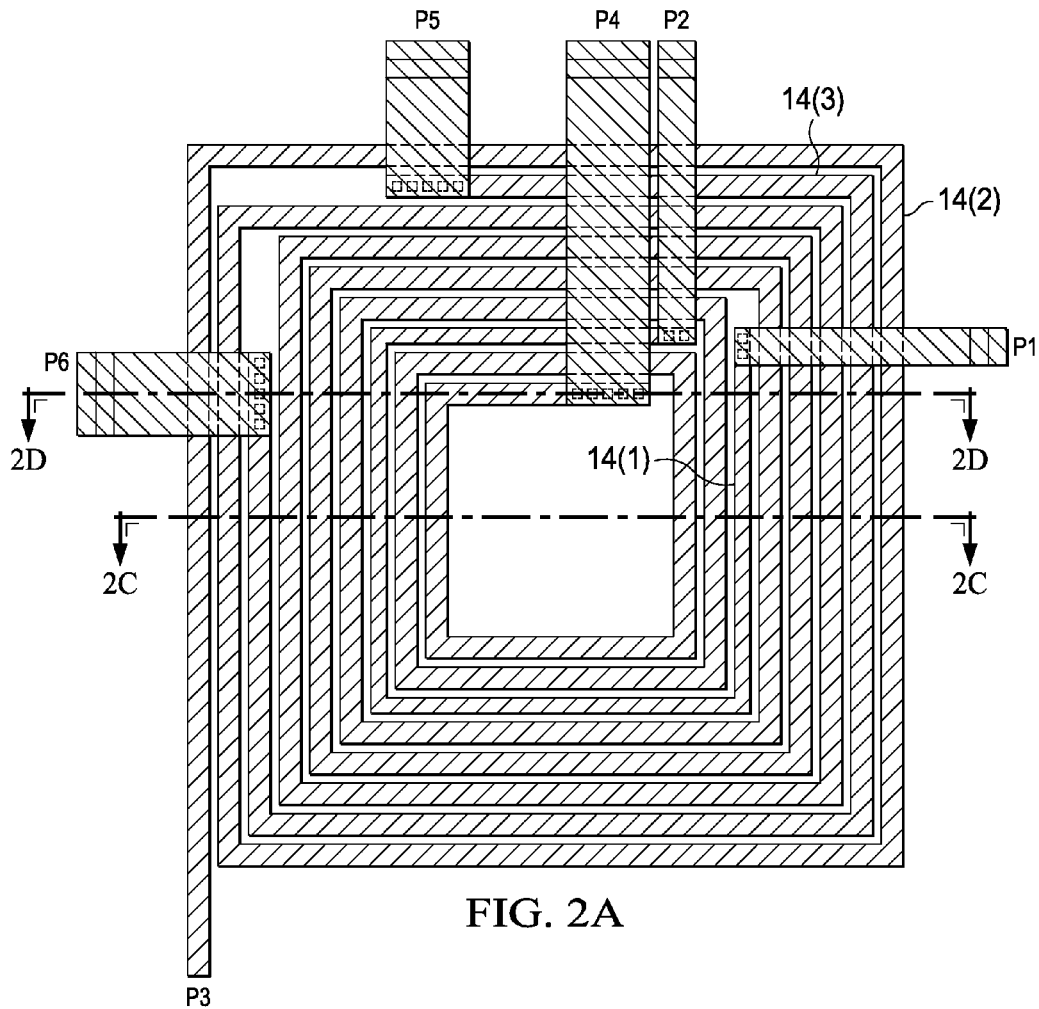

Turning to FIGS. 2A-2D, FIGS. 2A-2D are simplified diagrams illustrating example details of one or more embodiments of integrated circuit 10. FIG. 2A shows a simplified illustration of a top view of a layout of trifilar transformer 12 on a semiconductor chip. P1-P6 refers to ports of windings 14(1)-14(3). The semiconductor chip may comprise a plurality of alternating metallization and dielectric layers, with the metallization layers patterned according to a suitable mask to reveal electrical connections appropriately. In one example embodiment, each winding 14(1)-14(3) may be disposed on a separate metallization layer with intervening one or more dielectric (and/or metallization) layers. In another example embodiment, all windings 14(1)-14(3) may be disposed on the same metallization layer, with individual ports being taken out at one or more different metallization layers, with vias connecting the metallization layers appropriately. The process to create the windings on each metallization layer may be according to any suitable known process, such as subtractive etching process, damascene process, etc.

Each winding 14(1)-14(4) may be composed of approximately one or more turns around a central point. For example, windings 14(1) and 14(3) may include approximately one turn around a central point, and winding 14(2) may include approximately seven turns around the central point. The example windings 14(1)-14(3) shown in FIG. 2A are merely for illustrative purposes, and are not limitations. Any suitable layout and configuration of windings 14(1)-14(3) may be implemented within the broad scope of the embodiments.

Figure 2B:
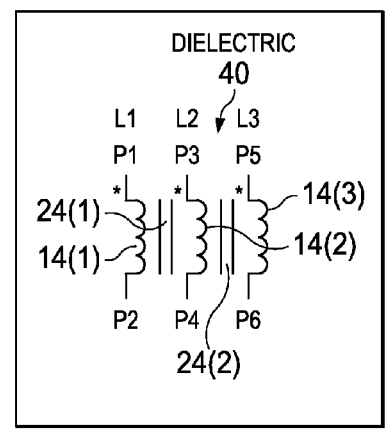

Turning to FIG. 2B, FIG. 2B is a simplified illustration of a representation of trifilar transformer 12. Windings 14(1)-14 (3), represented by appropriate circuit symbols, may be separated from each other (and from nearby metal traces of the turns) by dielectric 24 (e.g., 24(1) between windings 14(1)

and 14(3) and dielectric 24(2) between windings 14(2) and 14(3)), represented by two double lines between each pair of windings. Dielectric 24 may comprise one or more layers of any suitable dielectric (e.g., non-conducting) material with appropriate magnetic permeability. In some embodiments, magnetic permeability of dielectric 24 surrounding windings 14(1)-14(3) may be augmented by adding molecules or atoms of high permeable materials, for example, through an ion sputtering or ion implantation process.

Turning to FIG. 2C, FIG. 2C is a simplified illustration of a cross-section of trifilar transformer 12 of FIG. 2A along line 2C-2C according to one example embodiment. Each metallization layer (denoted in the FIGURE as Layer 1, Layer 2, and Layer 3) may be separated from each other by dielectric 24. Winding 14(3) may be disposed on Layer 2, winding 14(2) may be disposed on Layer 2, and winding 14(1) may be disposed on Layer 3.

Turning to FIG. 2D, FIG. 2D is a simplified illustration of a cross-section of trifilar transformer 12 of FIG. 2A along line 2D-2D according to another example embodiment. Each metallization layer (denoted in the FIGURE as Layer 1, and Layer 2) may be separated from each other by dielectric 24. According to the embodiment illustrated in FIG. 2D, the first dielectric core between windings 14(1) and 14(2) and the second dielectric core between windings 14(2) and 14(3) may be located on a common layer (e.g., Layer 2). Windings 14(1)-14(3) may be disposed on Layer 2, and ports P1-P6 may be taken out at Layer 1 through suitable vias. For example, along cross-section line 2D-2D, port P6 of winding 14(3) may be taken out (e.g., for electrical connectivity) at Layer 1; port P4 of winding 14(2) may also be taken out at Layer 1. In some embodiments, the layer at which the ports may be taken out may differ for each winding, depending on the electrical connectivity desired, or for other reasons. Any suitable physical layout and configuration of windings 14(1)-14(3) may be included within the broad scope of the embodiments.

Figure 3:
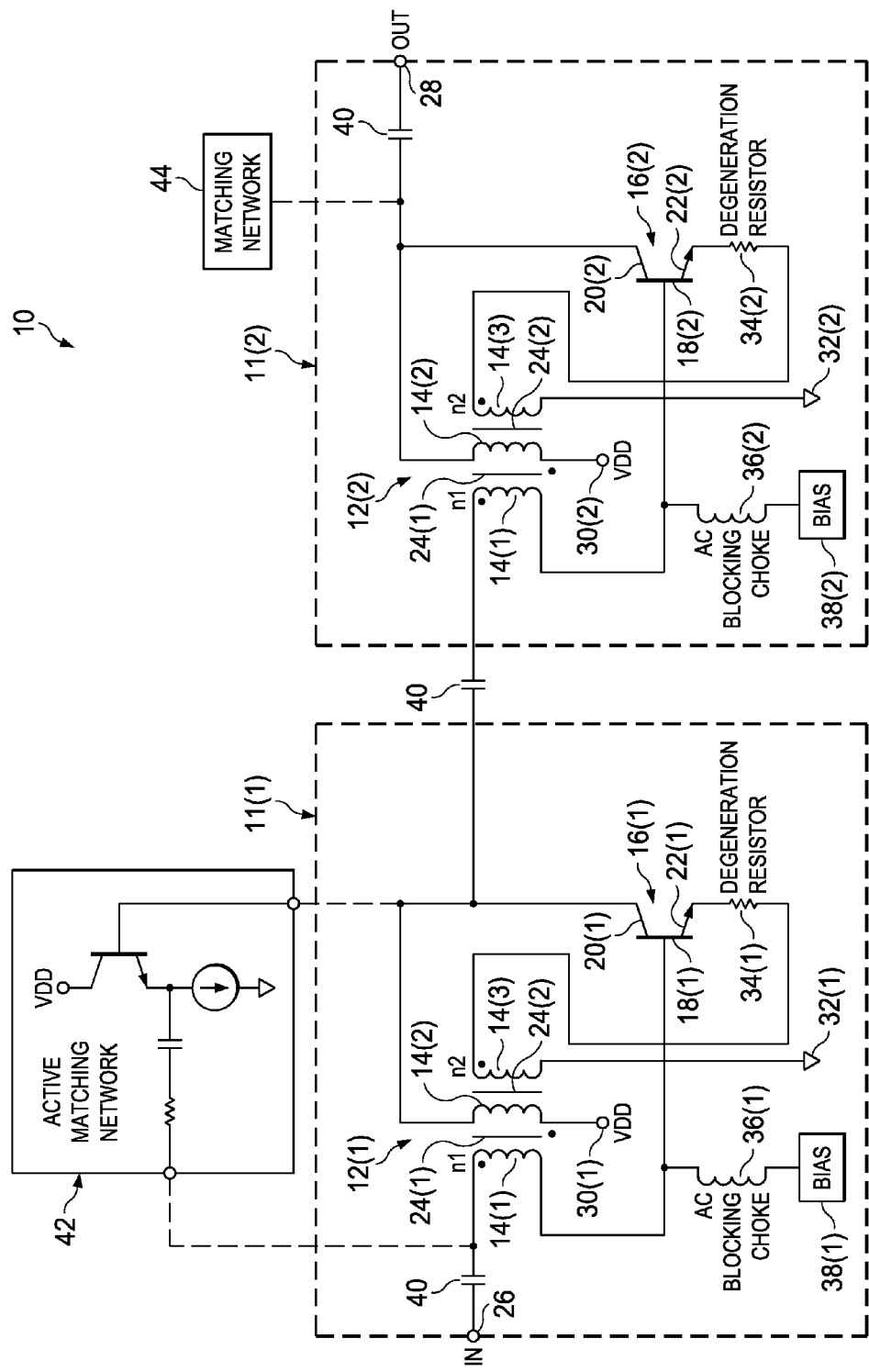
FIG. 3 is a simplified circuit diagram of other example details of the integrated circuit according to one embodiment.

Turning to FIG. 3, FIG. 3 is a simplified circuit diagram illustrating an example configuration of integrated circuit 10. The architecture of the RF amplifier 11 of FIG. 1 can be cascaded to implement higher gain. For example, two stages, comprising two RF amplifiers 11(1) and 11(2) may be coupled as illustrated in FIG. 3. Each RF amplifier 11(1) and 11(2) may include corresponding trifilar transformer 12(1) and 12(2), respectively, and gain device 16(1), and 16(2), respectively, in addition to other passive components, such as capacitors 40.

An input active matching network 42 and an output matching network 44 can be included to match the input and output, respectively, of the combined RF amplifier. In a general sense, impedance matching is widely used in the transmission of signals in many end applications including industrial, communications, video, medical, test, measurement, and military applications. Impedance matching can reduce reflections and preserve signal integrity. In general, when a source is connected to a load, maximum power transformation is achieved through conjugate matching of the load impedance (ZL) with source impedance (ZS) i.e. ZS=ZL*. Adjusting the input impedance (e.g., source impedance) or the output impedance (e.g., load impedance), in general, is called "impedance matching."

Active matching network 42 may provide feedback, which can lower the input noise of the combined RF amplifier. The input impedance of the combined RF amplifier may be relatively high, so if a passive matching network is used, some type of real resistance may be required to match the input. The resistive element may have noise, amplified by the combined RF amplifier, thus increasing the amplifier's overall noise. On the other hand, if an active feedback network as provided by active matching network 42 is used, the gain of RF amplifier 11(1) can tend to lower the overall noise of the combined RF amplifier.

Figure 4:
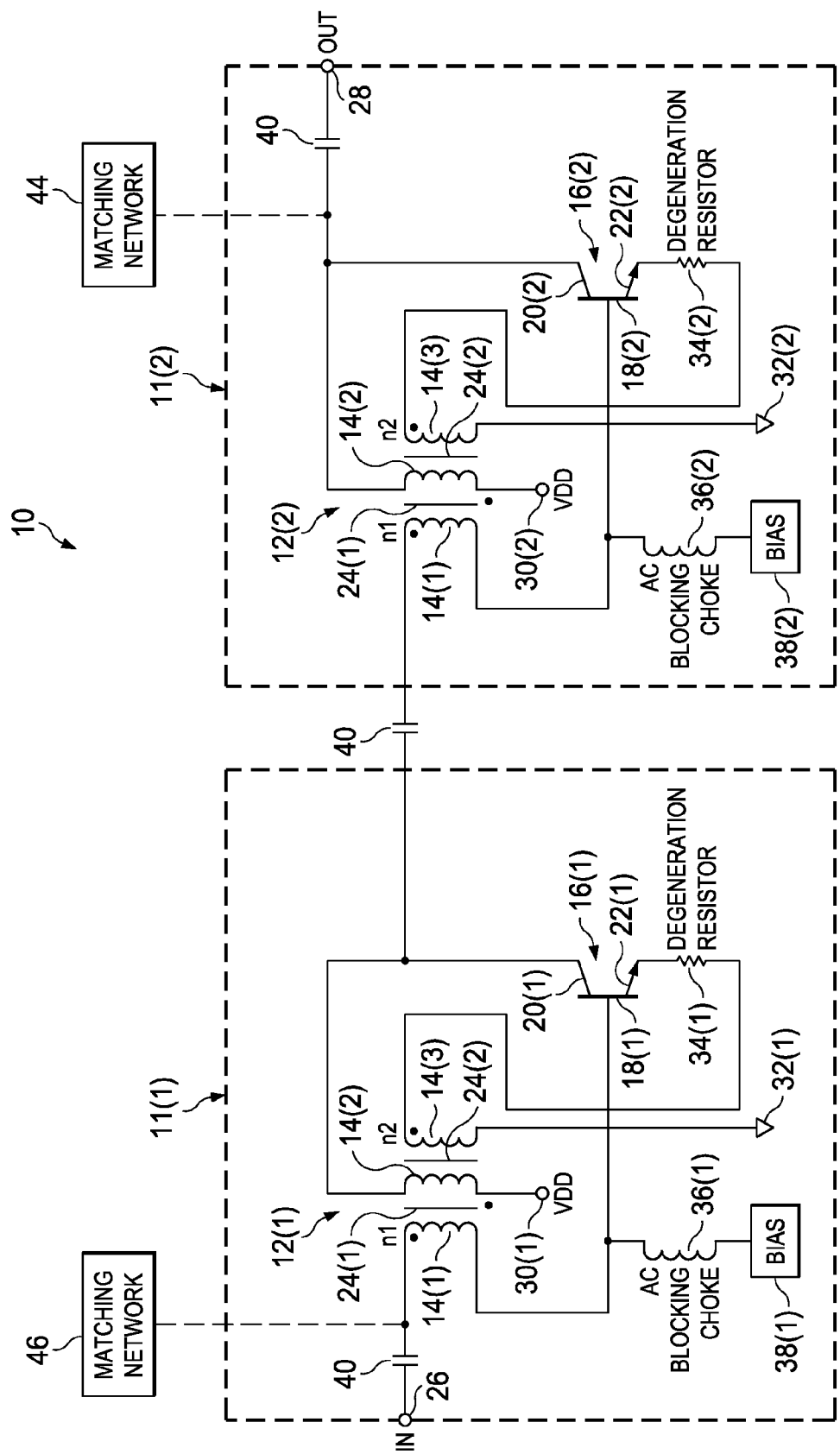
FIG. 4 is a simplified circuit diagram illustrating other example details of an embodiment of the integrated circuit.

Turning to FIG. 4, FIG. 4 is a simplified circuit diagram illustrating an example configuration of integrated circuit 10. The architecture of integrated circuit 10 of FIG. 3 may be modified to replace active feedback network 42 with a passive matching network 46. In cases where active feedback network 46 (of FIG. 3) cannot be used, or where a passive matching network may be more appropriate (and sufficient), passive matching network 46 may be used to provide input impedance. Passive matching networks 44 and 46 may include passive components (e.g., resistors, capacitors, inductors), whereas active matching network 42 may include, in addition, active components, such as transistors. Matching networks 42, 44 and 46 may include any suitable configuration known in the art that can provide input or output impedance, as appropriate, based on particular needs.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

In one example embodiment, RF amplifier 11 of the FIGURES may be coupled to a motherboard of an associated electronic device or system. The motherboard can be a general circuit board that can hold various components of the internal electronic system of the electronic device and, further, provide connectors for other peripherals. More specifically, the motherboard can provide the electrical connections by which the other components of the system can communicate. Any suitable processors (inclusive of digital signal processors, microprocessors, supporting chipsets, etc.), memory elements, etc. can be suitably coupled to the motherboard based on particular configuration needs, processing demands, computer designs, etc. Other components such as external storage, controllers for video display, sound, and peripheral devices may be attached to the motherboard as plug-in cards, via cables, or integrated into the motherboard itself.

In another example embodiment, RF amplifier 11 of the FIGURES may be embedded in stand-alone modules (e.g., a device with associated components and circuitry configured to perform a specific application or function) or integrated as plug-in modules into application specific hardware of electronic devices. Note that particular embodiments of the present disclosure may be readily included in a system on chip (SOC) package. An SOC represents an IC that integrates components of a computer or other electronic system into a single chip. It may contain digital, analog, mixed-signal, and often radio frequency functions: all of which may be provided on a single chip substrate. Other embodiments may include a multi-chip-module (MCM), with a plurality of separate ICs located within a single electronic package and configured to interact closely with each other through the electronic package. In various other embodiments, the amplification functionalities may be implemented in one or more silicon cores in Application Specific Integrated Circuits (ASICs), Field Programmable Gate Arrays (FPGAs), and other semiconductor chips.

It is also imperative to note that all of the specifications, dimensions, and relationships outlined herein (e.g., the number of processors and memory elements, logic operations, etc.) have only been offered for purposes of example and teaching only. Such information may be varied considerably without departing from the spirit of the present disclosure, or the scope of the appended claims. The specifications apply only to one non-limiting example and, accordingly, they should be construed as such. In the foregoing description, example embodiments have been described with reference to particular processor and/or component arrangements. Various modifications and changes may be made to such embodiments without departing from the scope of the appended claims. The description and drawings are, accordingly, to be regarded in an illustrative rather than in a restrictive sense.

Note that with the numerous examples provided herein, interaction may be described in terms of two, three, four, or more electronic components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this Specification. In certain cases, it may be easier to describe one or more of the functionalities of a given set of flows by only referencing a limited number of electronic elements. It should be appreciated that communication integrated circuit 10 of the FIGURES and its teachings are readily scalable and can accommodate a large number of components, as well as more complicated/sophisticated arrangements and configurations. Accordingly, the examples provided should not limit the scope or inhibit the broad teachings of communication integrated circuit 10 as potentially applied to a myriad of other architectures.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 112 as it exists on the date of the filing hereof unless the words "means for" or "step for" are specifically used in the particular claims; and (b) does not intend, by any statement in the specification, to limit this disclosure in any way that is not otherwise reflected in the appended claims.

What is claimed is:

1. An integrated circuit, comprising:
a radio frequency (RF) amplifier including a trifilar transformer coupled to a gain device in one or more negative feedback paths, wherein the trifilar transformer comprises a first winding, a second winding and a third winding, wherein a first dielectric core is disposed between the first winding and the second winding, and a second dielectric core is disposed between the second winding and the third winding, wherein a first winding ratio between the first winding and the second winding combined with a second winding ratio between the second winding and the third winding affects a total gain of the RF amplifier, and
wherein at least two RF amplifier outputs are coupled to the trifilar transformer.

2. The integrated circuit of claim 1, wherein the gain device is a transistor, and wherein the first winding is coupled to a base of the transistor, the second winding is coupled to a collector of the transistor, and the third winding is coupled to an emitter of the transistor.

3. The integrated circuit of claim 1, wherein the first winding is further coupled to an input to the RF amplifier, the second winding is further coupled to an output of the RF amplifier and a power supply, and the third winding is further coupled to a ground.

4. The integrated circuit of claim 1, further comprising a degeneration resistor coupled between an emitter and the third winding.

5. The integrated circuit of claim 1, further comprising an alternating current blocking choke disposed between the first winding and a base, wherein the alternating current blocking choke facilitates providing a direct current bias to the base.

6. The integrated circuit of claim 1, wherein the trifilar transformer is realized on the integrated chip having a plurality of layers, with the first dielectric core located on a layer that is different from the second dielectric core.

7. The integrated circuit of claim 1, wherein the trifilar transformer is realized on the integrated chip having a plurality of layers, with the first dielectric core and the second dielectric core located on a common layer.

8. The integrated circuit of claim 1, further comprising an additional RF amplifier including an additional trifilar transformer coupled to another gain device cascaded together for higher gain amplification, wherein the additional trifilar transformer is coupled to one of the outputs of the RF amplifier.

9. The integrated circuit of claim 8, further comprising a matching network at an output of the additional RF amplifier to match an output impedance.

10. The integrated circuit of claim 8, further comprising a matching network at an input to the RF amplifier to match an input impedance.

11. The integrated circuit of claim 8, further comprising an active matching network across the trifilar transformer to match an input impedance.

12. A system, comprising:
a motherboard;
a plurality of electronic components coupled to the motherboard; and
a radio frequency (RF) amplifier including a trifilar transformer coupled to a gain device in one or more negative feedback paths, wherein the trifilar transformer comprises:
a first winding;
a second winding; and
a third winding; wherein a first dielectric core is disposed between the first winding and the second winding, and a second dielectric core is disposed between the second winding and the third winding, wherein a first winding ratio between the first winding and the second winding combined with a second winding ratio between the second winding and the third winding affects a total gain of the RF amplifier,
wherein at least two RF amplifier outputs are coupled to the trifilar transformer.

13. The system of claim 12, wherein the gain device is a transistor.

14. The system of claim 13, wherein the first winding is coupled to a base of the transistor, the second winding is coupled to a collector of the transistor, and the third winding is coupled to an emitter of the transistor.

15. The system of claim 12, wherein the first winding is further coupled to an input to the RF amplifier, the second winding is further coupled to an output of the RF amplifier and a power supply, and the third winding is further coupled to a ground.

16. The system of claim 12, further comprising a degeneration resistor coupled between an emitter and the third winding.

17. The system of claim 12, further comprising an alternating current blocking choke disposed between the first winding and a base, wherein the alternating current blocking choke facilitates providing a direct current bias to the base.

18. The system of claim 12, wherein the trifilar transformer is realized on the integrated chip having a plurality of layers, with the first dielectric core located on a layer that is different from the second dielectric core.

19. The system of claim 12, wherein the trifilar transformer is realized on the integrated chip having a plurality of layers, with the first dielectric core and the second dielectric core located on a common layer.

20. The system of claim 12, further comprising an additional RF amplifier including an additional trifilar transformer coupled to another gain device cascaded together for higher gain amplification, wherein the additional trifilar transformer is coupled to to one of the outputs of the RF amplifier.

\* \* \* \* \*